(12) United States Patent
Oka et al.

(10) Patent No.: US 7,893,777 B2
(45) Date of Patent: Feb. 22, 2011

(54) VOLTAGE CONTROLLED OSCILLATION CIRCUIT

(75) Inventors: Takashi Oka, Osaka (JP); Seiji Watanabe, Kyoto (JP)

(73) Assignee: Panasonic Corporation, Osaka (JP)

( * ) Notice: Subject to any disclaimer, the term of this patent is extended or adjusted under 35 U.S.C. 154(b) by 63 days.

(21) Appl. No.: 11/885,410

(22) PCT Filed: Mar. 12, 2007

(86) PCT No.: PCT/JP2007/054821
§ 371 (c)(1),
(2), (4) Date: Aug. 31, 2007

(87) PCT Pub. No.: WO2007/108348
PCT Pub. Date: Sep. 27, 2007

(65) Prior Publication Data
US 2008/0136539 A1 Jun. 12, 2008

(30) Foreign Application Priority Data
Mar. 23, 2006 (JP) .............................. 2006-080199

(51) Int. Cl.
*H03K 3/03* (2006.01)
(52) U.S. Cl. .................. 331/57; 331/15; 331/177 R; 331/185
(58) Field of Classification Search .................. 331/15, 331/57, 177 R, 182
See application file for complete search history.

(56) References Cited

U.S. PATENT DOCUMENTS 5,459,653 A * 10/1995 Seto et al. ...................... 363/73
5,748,048 A 5/1998 Moyal
6,111,456 A * 8/2000 Saito et al. .................. 327/541
6,166,592 A * 12/2000 Walden ....................... 327/562
6,188,285 B1 2/2001 Nakanishi et al.
6,392,497 B1 * 5/2002 Takikawa ..................... 331/17

(Continued)

FOREIGN PATENT DOCUMENTS

JP 05-145412 6/1993

(Continued)

OTHER PUBLICATIONS

Japanese Notice of Reasons for Rejection, with English Translation, issued in Japanese Patent Application No. JP 2007-524114, mailed on Oct. 6, 2009.

*Primary Examiner*—Joseph Chang
*Assistant Examiner*—Jeffrey Shin
(74) *Attorney, Agent, or Firm*—McDermott Will & Emery LLP

(57) ABSTRACT

In a voltage controlled oscillation circuit including a cascade connection of a voltage-to-current conversion circuit (310) for generating an input voltage converted current which is a current corresponding to an input voltage and a current controlled oscillation circuit (120) of which an oscillation frequency varies according to the input voltage converted current, the voltage-to-current conversion circuit (310) includes a first current source for outputting a current in proportion to the input voltage and a plurality of second current sources for outputting a current in proportion to a voltage obtained by shifting the input voltage. Then, a current obtained by adding a current output from the first current source and currents output from the plurality of current sources is output as the input voltage converted current to the current controlled oscillation circuit (120).

2 Claims, 4 Drawing Sheets

U.S. PATENT DOCUMENTS

| | | | |
|---|---|---|---|
| 6,404,294 B1 * | 6/2002 | Sha et al. | 331/57 |
| 2003/0042985 A1 * | 3/2003 | Shibahara et al. | 331/17 |
| 2003/0090330 A1 * | 5/2003 | Sakurai et al. | 331/57 |
| 2003/0222722 A1 | 12/2003 | Kwon | |
| 2004/0090276 A1 * | 5/2004 | Kiyose et al. | 331/57 |
| 2005/0258910 A1 * | 11/2005 | Tung | 331/18 |
| 2008/0106345 A1 * | 5/2008 | Huang | 331/57 |

FOREIGN PATENT DOCUMENTS

| | | |
|---|---|---|
| JP | 2000-134092 | 5/2000 |
| JP | 2003-198333 | 7/2003 |
| JP | 2003-229764 | 8/2003 |
| JP | 2004-007588 | 1/2004 |

* cited by examiner

VOLTAGE CONTROLLED OSCILLATION CIRCUIT

RELATED APPLICATIONS

This application is the U.S. National Phase under 35 U.S.C. §371 of International Application No. PCT/JP2007/054821, filed on Mar. 12, 2007, which in turn claims the benefit of Japanese Application No. 2006-080199, filed on Mar. 23, 2006, the disclosures of which Applications are incorporated by reference herein.

TECHNICAL FIELD

The present invention relates to a voltage controlled oscillation circuit which is applied to a PLL (Phase Locked Loop) circuit and of which an oscillation frequency is controlled according to an input voltage.

BACKGROUND ART

For a PLL circuit, a voltage controlled oscillation circuit of which an oscillation frequency is controlled according to an input voltage is used (see, for example, Patent Reference 1).

There is a known voltage controlled oscillation circuit formed so as to have, for example, a configuration of FIG. 5. A voltage controlled oscillation circuit 400 of FIG. 5 includes a cascade connection of a voltage-to-current conversion circuit 410 and a current controlled oscillation circuit 420. The voltage-to-current conversion circuit 410 is a circuit for generating a current (i.e., an input voltage converted current) corresponding to an input voltage (i.e., an input voltage Vin). Moreover, the current controlled oscillation circuit 420 is a circuit of which an oscillation frequency is changed according to the input voltage converted current generated by the voltage-to-current conversion circuit 410.

The voltage-to-current conversion circuit 410 includes an N-channel MOS transistor 411, a P-channel MOS transistor 412 and a resistor 413.

The N-channel MOS transistor 411 has a gate connected to the input voltage Vin and a drain connected to a gate and a drain of the P-channel MOS transistor 412. A source of the N-channel MOS transistor 411 is grounded via the resistor 413. The P-channel MOS transistor 412 is a transistor constituting an input voltage converted current source and has a source connected to a power source VDD.

The current controlled oscillation circuit 420 includes delay cells provided in a plurality of stages. The number of stages of the delay cells may be an odd number larger than 2. In the following description, an example in which the current controlled oscillation circuit 420 includes delay cells 421 through 427 provided in seven stages will be shown. Although only two delay cells, i.e., delay cells 421 and 427 are illustrated in an example shown in FIG. 5, delay cells 422 through 426 are provided between the delay cells 421 and 427. That is, the delay cell 421 is a delay cell in the first stage and the delay cell 427 is a delay cell in the last stage. The delay cells all have the same configuration and, therefore, the delay cell 421, representing the delay cells, will be described.

As shown in FIG. 5, the delay cell 421 includes a P-channel MOS transistor 421a, a P-channel MOS transistor 421b, an N-channel MOS transistor 421c and a capacitor 421d.

The P-channel MOS transistor 421a constitutes a current source. A source of the P-channel MOS transistor 421a is connected to a power source VDD, a drain thereof is connected to a source of the P-channel MOS transistor 421b. Moreover, a gate of the P-channel MOS transistor 421a is connected to a potential of a node of a gate and a drain of the P-channel MOS transistor 412 and a drain of the N-channel MOS transistor 411.

The P-channel MOS transistor 421b has a drain connected to a drain of the N-channel MOS transistor 421c and is grounded via the capacitor 421d. A source of the N-channel MOS transistor 421c is grounded.

Respective drains of the P-channel MOS transistor 421b and the N-channel MOS transistor 421c which constitute a delay cell are connected to respective gates of the P-channel MOS transistor 421b and the N-channel MOS transistor 421c of constituting a delay cell in the subsequent stage. Moreover, the drains (which will be referred to as output ends) of the P-channel MOS transistor 421b and the N-channel MOS transistor 421c constituting a delay cell in the last stage are connected to respective gates of the P-channel MOS transistor 421b and the N-channel MOS transistor 421c constituting a delay cell in the first stage.

The operation of the voltage controlled oscillation circuit 400 will be described.

First, the N-channel MOS transistor 411 is connected in a source follower connection. When the input voltage Vin is larger than Vth, a potential of a node (i.e., a node A) of the N-channel MOS transistor 411 and the resistor 413 is about (Vin−Vth). Vth is a threshold voltage of a transistor. Therefore, when the input voltage Vin is changed, the potential of the node A is changed. If a resistance value of the resistor 413 is R413, a current (i.e., an input voltage converted current value Io) flowing in the resistor 413 can be determined by:

$$Io=(Vin-Vth)/R413.$$

An equal current to the above current flows in the N-channel MOS transistor 411 and the P-channel MOS transistor 412 constituting the input voltage converted current source. Accordingly, the input voltage Vin is shifted by Vth and thus a linear current to the input voltage Vin flows in the input voltage converted current source (i.e., the P-channel MOS transistor 412).

On the other hand, the potential of the gate and drain of the P-channel MOS transistor 412 and the drain of the N-channel MOS transistor 411, which determines a current of the input voltage converted current source (i.e., the P-channel MOS transistor 412), determines a current value of a current source (i.e., the P-channel MOS transistor 421a) in each delay cell in the current controlled oscillation circuit 420. Thus, respective current values of those current sources are equal to one another.

Subsequently, the operation of a delay cell will be described. When a voltage applied to the gates of the P-channel MOS transistor 421b and the N-channel MOS transistor 421c in a delay cell is a Low level, the P-channel MOS transistor 421b passes a current and the N-channel MOS transistor 421c does not flow a current. In this case, a current value of a current which the P-channel MOS transistor 421b passes is determined by a current source (i.e., the P-channel MOS transistor 421a) in the delay cell and the current value is an input voltage converted current value Io. By this current, the capacitor 421d is charged with electric charges and the potential of a node of the P-channel MOS transistor 421b and the N-channel MOS transistor 421c is increased.

Next, when the voltage applied to the gates of the P-channel MOS transistor 421b and the N-channel MOS transistor 421c is increased from the Low level and exceeds the threshold voltage Vth of the N-channel MOS transistor 421c, the N-channel MOS transistor 421c passes a current. A current which the N-channel MOS transistor 421c passes is determined by a voltage applied to the gates of the P-channel MOS transistor 421b and the N-channel MOS transistor 421c. Furthermore, when the voltage applied to the gates of the P-channel MOS transistor 421b and the N-channel MOS transistor 421c is increased and an amount of the current which the P-channel MOS transistor 421b passes is larger than an amount of the current which the N-channel MOS transistor 421c passes, charges in the capacitor 421d are discharged and the potential of the node of the P-channel MOS transistor 421b and the N-channel MOS transistor 421c drops. The delay cell repeats the above-described operation.

Next, the relationship between the input voltage converted current value Io and an oscillation frequency (i.e., an oscillation frequency fout) of an output signal Vout (i.e., a signal output from the drains of the P-channel MOS transistor 421b and the N-channel MOS transistor 421c) will be described.

The relationship between the input voltage converted current value Io and the oscillation frequency fout of the output signal Vout is determined by the number of stages of delay cells. In this embodiment, the relationship between the input voltage converted current value Io and the oscillation frequency fout will be described using the case of delay cells in seven stages as an example.

FIG. 6 shows voltages applied to respective gates of P-channel MOS transistors 421b and N-channel MOS transistors 421c in the delay cells 421 through 427. When a voltage applied to the gates of the P-channel MOS transistor 421b and the N-channel MOS transistor 421c in the delay cell 421 is the Low level, a voltage applied to each of the gates of the P-channel MOS transistor 421b and the N-channel MOS transistor 421c in the delay cell 422 is increased. A current which the P-channel MOS transistor 421b in the delay cell 421 passes is determined by a current of the power source (i.e., the P-channel MOS transistor 421a) of the delay cell 421 and thus, as shown in FIG. 6, is increased in a constant slope.

When the voltage applied to the gates of the P-channel MOS transistor 421b and the N-channel MOS transistor 421c in the delay cell 422 is increased and the current which the P-channel MOS transistor 421b passes is larger than the current which the N-channel MOS transistor 421c passes in the delay cell 422, the voltage applied to the gates of the P-channel MOS transistor 421b and the N-channel MOS transistor 421c drops. At this time, the current which the N-channel MOS transistor 421c passes is determined by the voltage applied to the gates of the P-channel MOS transistor 421b and the N-channel MOS transistor 421c in the delay cell 422, and thus rapidly drops to the Low level. By repeating the above-described operation by the delay cells, a signal with a predetermined oscillation cycle is output. The oscillation cycle is as follows.

If a voltage applied to the gates of the P-channel MOS transistor 421b and the N-channel MOS transistor 421c when the voltage applied to the gates of the P-channel MOS transistor 421b and the N-channel MOS transistor 421c in a delay cell is increased and the current which the P-channel MOS transistor 421b passes and the current which the N-channel MOS transistor 421c passes are equal to each other is Vsw, a time which it takes to increase from the Low level to Vsw is Tsw and a capacitance value of the capacitor 421d is Co, the oscillation cycle can be expressed by:

$$Tsw = Co \times Vsw/Io.$$

As shown in FIG. 6, in the case where delay cells are provided in seven stages, 1 cycle is 7×Tsw. In the same manner, in the case where delay cells are provided in n stages, since 1 cycle is n×Tsw, an oscillation frequency of the output signal Vout of the nth stage cell can be expressed by:

$$fout = 1/(n \times Tsw)$$
$$= Io/(n \times Co \times Vsw).$$

Therefore, the relationship between the input voltage Vin and the oscillation frequency fout of the output voltage Vout is expressed by:

$$fout = (Vin - Vth)/(n \times Co \times Vsw \times R413).$$

Therefore, the input voltage Vin is shifted by Vth and thus the oscillation frequency fout of the output signal Vout which is linear to the input voltage Vin is achieved.

Patent Reference 1: Japanese Laid-Open Publication No. 5-145412

DISCLOSURE OF THE INVENTION

Problems that the Invention is to Solve

By the way, a voltage controlled oscillation circuit influences stability of a PLL circuit and thus is required to have the characteristic that an output frequency to an input voltage is linear.

However, in the above-described known voltage controlled oscillation circuit, the linear characteristic of the oscillation frequency fout of the output signal Vout to the input voltage Vin is excellent in a region with a lower frequency than a predetermined frequency but the linear characteristic of the oscillation frequency fout of the output signal Vout to the input voltage Vin is deteriorated in a high frequency region with a higher frequency than the predetermined frequency.

This is because in the known voltage controlled oscillation circuit, it is permissible to assume that in a low frequency region with a lower frequency than the predetermined frequency, the voltage Vsw is constant despite the input voltage converted current value Io but in the high frequency region with a higher frequency than the predetermined frequency, the dependency on Io is increased as described below.

Assume that a voltage applied to the gates of the P-channel MOS transistor 421b and the N-channel MOS transistor 421c is Vsw and respective currents flowing in the P-channel MOS transistor 421b and the N-channel MOS transistor 421c are I421b and I421c, respectively. Then, the following expressions hold.

$$I421b = Io$$

$$I421c = \beta/2 \times (Vsw - Vth)^2$$

Note that the symbol ^ is an exponentiation operator.

In the above expressions, for β, β=u×Cox×W/L (where u is the degree of electron movement, Cox is a gate capacitance, W is a channel width of a transistor and L is a channel length of a transistor) holds. Moreover, Vth is a threshold voltage of a transistor.

Since above I421b and I421c are equal to each other, then $$Io = \beta/2 \times (Vsw - Vth)^2$$

holds. Vsw is expressed by the following expression using Io.

$$Vsw = Vth + (2 \times Io/\beta)^{0.5}$$

The above-described expression shows that the voltage Vsw applied to the gates of the P-channel MOS transistor 421b and the N-channel MOS transistor 421c when the current which the P-channel MOS transistor 421b passes and the current which the N-channel MOS transistor 421c passes are equal to each other in a delay cell varies according to the input voltage converted current value Io of the current source (i.e., the P-channel MOS transistor 421a). In this case, the relationship between the input voltage converted current value Io and the oscillation frequency fout of the output signal Vout is expressed by:

$$fout = Io/(n \times Co \times (Vth + (2 \times Io/\beta)^{0.5}))$$

where Co is a capacitance of the capacitor 421d.

The above expression shows that when the input voltage converted current value Io of the high frequency region, i.e., the P-channel MOS transistor 421a is large, the oscillation frequency fout of the output signal Vout is reduced and thus results in deterioration of the linear characteristic.

In view of the above-described problems, the present invention has been devised and it is therefore an object of the present invention to provide a voltage controlled oscillation circuit which achieves a linear output frequency to an input voltage even in a high frequency region and improvement of stability of a PLL circuit within a wide frequency range.

Solution to the Problems

To solve the above-described problems, the present invention, in one embodiment, is directed to a voltage controlled oscillation circuit including a cascade connection of a voltage-to-current conversion circuit for generating an input voltage converted current which is a current corresponding to an input voltage and a current controlled oscillation circuit of which an oscillation frequency varies according to the input voltage converted current, and is characterized in that the voltage-to-current conversion circuit includes a first current source for outputting a current in proportion to the input voltage and a plurality of second current sources for outputting a current in proportion to a voltage obtained by shifting the input voltage and outputs, as the input voltage converted current, a current obtained by adding a current output from the first current source and currents output from the plurality of current sources to the current controlled oscillation circuit.

Effects of the Invention

According to the present invention, in a voltage controlled oscillation circuit, a linear output frequency to an input voltage can be achieved with a wide frequency range. Therefore, in a PLL circuit to which a voltage controlled oscillation circuit according to the present invention is applied, stability of the PLL circuit is improved in a wide frequency region.

EXPLANATION OF REFERENCE NUMERALS

Figure 1:
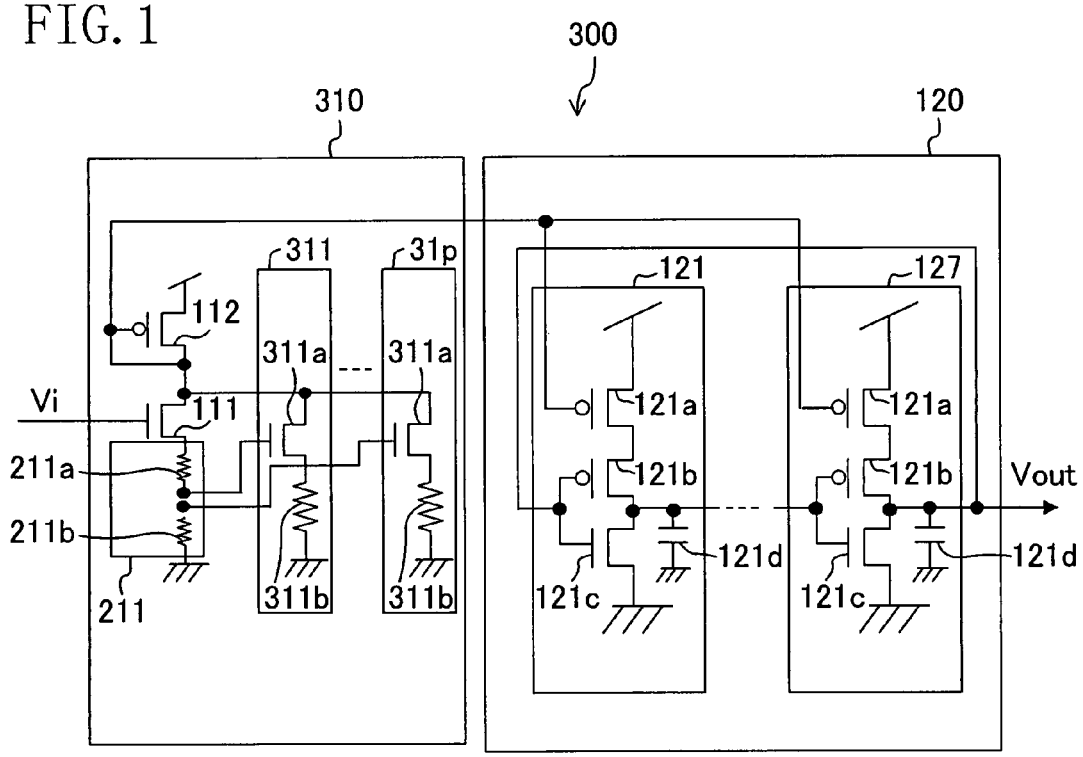
FIG. 1 is a block diagram illustrating a configuration of a voltage controlled oscillation circuit according to Embodiment 1.

100 Voltage controlled oscillation circuit
110 Voltage-to-current conversion circuit
111 N-channel MOS transistor
112 P-channel MOS transistor
113 Resistor
114 N-channel MOS transistor
115 N-channel MOS transistor
116 P-channel MOS transistor
120 Current controlled oscillation circuit
121 through 127 Delay cells
121a P-channel MOS transistor
121b P-channel MOS transistor
121c N-channel MOS transistor
121d Capacitor
200 Voltage controlled oscillation circuit
210 Voltage-to-current conversion circuit
211 Resistor
211a and 211b Resistors
212 N-channel MOS transistor
300 Voltage controlled oscillation circuit
310 Voltage-to-current conversion circuit
311 through 31p Current sources
311a N-channel MOS transistor
311b Resistor

BEST MODE FOR CARRYING OUT THE INVENTION

Hereafter, embodiments and reference examples of the present invention will be described with reference to the accompanying drawings.

Embodiment 1 of the Invention

FIG. 1 is a block diagram illustrating a configuration of a voltage controlled oscillation circuit 300 according to Embodiment 1 of the present invention. The voltage controlled oscillation circuit 300 is a circuit for outputting a signal (i.e., an output signal Vout) with a frequency corresponding to a received voltage (i.e., an input voltage Vin). The voltage controlled oscillation circuit 300 includes a cascade connection of a voltage-to-current conversion circuit 310 and a current controlled oscillation circuit 120. The voltage-to-current conversion circuit 310 is a circuit for generating a current (i.e., an input voltage converted current) corresponding to the input voltage Vin. The current controlled oscillation circuit 120 is a circuit of which an oscillation frequency varies according to an input voltage converted current generated by the voltage-to-current conversion circuit 310.

A voltage-to-current conversion circuit 310 includes an N-channel MOS transistor 111, a P-channel MOS transistor 112, a resistor 211 and a plurality of current sources (i.e., current sources 311 through 31p).

The N-channel MOS transistor 111 has a gate connected to the input voltage Vin and a drain connected to a gate and a drain of the P-channel MOS transistor 112. Moreover, a source of the N-channel MOS transistor 111 is grounded via a resistor 113.

The P-channel MOS transistor 112 is a transistor constituting an input voltage converted current source. A source of the P-channel MOS transistor 112 is connected to a power source VDD.

As shown in FIG. 1, a resistor 211 includes a plurality of resistors connected in series. In FIG. 1, only two resistors, i.e., resistors 211a and 211b are illustrated. However, more resistors may be connected in series.

Each power source is a circuit for generating a linear current to an input voltage. In the example of FIG. 1, two power sources, i.e., power sources 311 and 31p are illustrated. However, between the power sources 311 and 31p, more current sources may be provided. The power sources all have the same configuration and therefore the power source 311, representing the power sources, will be described.

As shown in FIG. 1, the power source 311 includes an N-channel MOS transistor 311a and a resistor 311b.

The N-channel MOS transistor 311a has a source grounded via the resistor 311b, a drain connected to a node of the N-channel MOS transistor 111 and the P-channel MOS transistor 112 and a gate connected to either one of a node (i.e., a node A) of the N-channel MOS transistor 111 and the resistor 211 and a node of resistors (i.e., the resistors 211a and 211b in this example). That is, a potential of the node A or a potential obtained by resistance dividing a potential between the node A and the ground is received at the gate of the N-channel MOS transistor 311a.

The current controlled oscillation circuit 120 includes delay cells provided in a plurality of stages. The number of stages of delay cells may be an odd number larger than 2. In the following description, an example in which the current controlled oscillation circuit 120 includes delay cells 121 through 127 provided in seven stages will be shown. Although only two delay cells, i.e., delay cells 121 and 127 are illustrated in an example shown in FIG. 1, delay cells 122 through 126 are provided between the delay cells 121 and 127. That is, the delay cell 121 is a delay cell in a first stage and the delay cell 127 is a delay cell in a last stage. The delay cells all have the same configuration and, therefore, the delay cell 121, representing the delay cells, will be described.

As shown in FIG. 1, the delay cell 121 includes P-channel MOS transistors 121a and 121b, an N-channel transistor 121c and a capacitor 121d.

The P-channel MOS transistor 121a constitutes a current source. A source of the P-channel MOS transistor 121a is connected to a power source VDD and a drain thereof is connected to a source of the P-channel MOS transistor 121b. Moreover, a gate of the P-channel MOS transistor 121a is connected to a potential of a node of a gate and a drain of the P-channel MOS transistor 112 and a drain of the N-channel MOS transistor 111.

The P-channel MOS transistor 121b has a drain connected to a drain of the N-channel transistor 121c and is grounded via the capacitor 121d. A source of the N-channel transistor 121c is grounded.

The drains of the P-channel MOS transistor 121b and the N-channel transistor 121c which constitute a delay cell are connected to respective gates of the P-channel MOS transistor 121b and the N-channel transistor 121c which constitute a delay cell in the subsequent stage. Moreover, respective drains (which will be referred to as output ends) of the P-channel MOS transistor 121b and the N-channel transistor 121c which constitute a delay cell in the last stage are connected to respective gates of the P-channel MOS transistor 121b and the N-channel transistor 121c which constitute a delay cell in the first stage.

Next, the operation of the voltage controlled oscillation circuit 300 will be described.

In the voltage controlled oscillation circuit 300, the N-channel MOS transistor 311a is connected in a source follower connection. Assume that a voltage applied to a gate of the N-channel MOS transistor 311a is Vc. Then, when the voltage Vc applied to the gate of the N-channel MOS transistor 311a is larger than Vth, a voltage of a node of the N-channel MOS transistor 311a and the resistor 311b is about (Vc−Vth).

Accordingly, if a resistance value of the resistor 311b is R311b, a current value I8 flowing in the N-channel MOS transistor 311a and the resistor 311b can be expressed by:

$$I8=(Vc-Vth)/R311b.$$

The above expression shows that the voltage Vc applied to the gate of the N-channel MOS transistor 311a is shifted by Vth and thus a linear current flows.

The input voltage converted current value Io will be specifically described using the power sources 311 through 31p. In each of the power sources 311 through 31p, a voltage obtained by resistance dividing a voltage at the node A of the N-channel MOS transistor 111 and the resistor 211 is applied to the gate of the N-channel MOS transistor 311a by the resistors 211a and 211b.

Assume that voltages applied to respective gates of the N-channel MOS transistor 311a in the power sources 311 through 31p are β311×(Vin−Vth) through β31p×(Vin−Vth), respectively. Note that each of β311 through β31p is a constant of 0 to 1. Moreover, if resistance values of respective resistors 311b of the power sources 311 through 31p are R311 through R31p, respectively, and current values of currents flowing in respective N-channel MOS transistors 311a of the power sources 311 through 31p are I311 through I31p, respectively, the following expressions hold.

$$I311=\beta311\times(Vin-(Vth+Vth/\beta311))/R311$$

$$I31p=\beta31p\times(Vin-(Vth+Vth/\beta31p))/R31p$$

Since a current I6 flowing in the resistor 211 and the respective currents I311 through I31p flowing in respective N-channel MOS transistors 311a of the power sources 311 through 31p flow in the P-channel MOS transistor 112, the input voltage converted current value Io flowing through an input voltage converted current source (i.e., the P-channel MOS transistor 112) is determined by:

$$Io=(Vin-Vth)/R211+\beta311\times(Vin-(Vth+Vth/\beta311))/R311+\ldots+\beta31p\times(Vin-(Vth+Vth/\beta31p))/R31p.$$

In contrast to the case where the oscillation frequency is reduced in a high frequency region if only the current I6 having a linear characteristic to an input voltage flows, in the voltage controlled oscillation circuit 300, reduction in the oscillation frequency can be corrected by the plurality of currents I311 through I31p each having a linear characteristic to an input voltage.

If the currents applied to the gates of the respective N-channel MOS transistors 311a of the power sources 311 through 31p are changed by changing resistant values of the resistors 211a through 211b which constitute 211, a voltage at which correction is started can be arbitrarily set. That is, in this embodiment, a region which is desired to be corrected can be arbitrarily selected and an amount of correction can be arbitrarily selected by changing the resistance values R311 through R31p.

Furthermore, since a current (i.e., a current with a linear characteristic) which each of the power sources outputs is determined by a resistor, as shown in the following reference examples and modified examples thereof, compared to the case where a current exhibiting the characteristic that an increase rate for slope is positive is determined by a conductance gm of a transistor, fluctuations in a current value due to influences of fabrication process and an ambient temperature can be suppressed.

Reference Example 1

Figure 2:
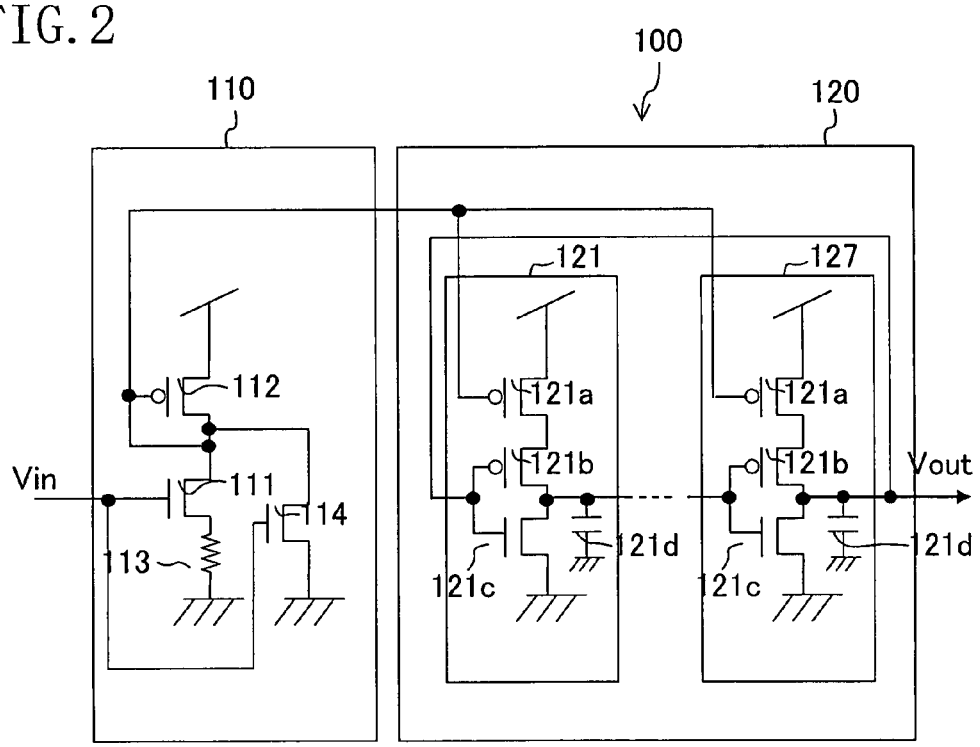
FIG. 2 is a block diagram illustrating a configuration of a voltage controlled oscillation circuit according to Reference Example 1.

FIG. 2 is a block diagram illustrating a configuration of a voltage controlled oscillation circuit 100 according to Reference Example 1. The voltage controlled oscillation circuit 100 is a circuit for outputting a signal (i.e., an output signal Vout) with a frequency corresponding to a received voltage (i.e., an output signal Vout). As shown in FIG. 2, the voltage controlled oscillation circuit 100 includes a cascade connection of a voltage-to-current conversion circuit 110 and a current controlled oscillation circuit 120. The voltage-to-current conversion circuit 110 is a circuit for generating a current (i.e., an input voltage converted current) corresponding to the input voltage Vin. The current controlled oscillation circuit 120 is a circuit of which an oscillation frequency is controlled according to the input voltage converted current generated by the voltage-to-current conversion circuit 110.

The voltage-to-current conversion circuit 110 includes an N-channel MOS transistor 111, a P-channel MOS transistor 112, a resistor 113 and an N-channel MOS transistor 114.

The N-channel MOS transistor 111 has a gate connected to the input voltage Vin and a drain connected to a gate and a drain of the P-channel MOS transistor 112. A source of the N-channel MOS transistor 111 is grounded via the resistor 113.

The P-channel MOS transistor 112 is a transistor constituting an input voltage converted current source. A source of the P-channel MOS transistor 112 is connected to a power source VDD.

An N-channel MOS transistor 114 has a gate connected to the input voltage Vin of the voltage-to-current conversion circuit 110. A source of the N-channel MOS transistor 114 is grounded and a drain thereof is connected to a node of the N-channel MOS transistor 111 and the P-channel MOS transistor 112.

The current controlled oscillation circuit 120 includes delay cells provided in a plurality of stages. The number of stages of the delay cells may be an odd number larger than 2. In the following description, an example in which the current controlled oscillation circuit 120 includes delay cells 121 through 127 provided in seven stages will be shown. Although only two delay cells, i.e., delay cells 121 and 127 are illustrated in an example shown in FIG. 2, delay cells 122 through 126 are provided between the delay cells 121 and 127. That is, the delay cell 121 is a delay cell in the first stage and the delay cell 127 is a delay cell in the last stage. The delay cells all have the same configuration and, therefore, the delay cell 121, representing the delay cells, will be described.

As shown in FIG. 2, the delay cell 121 includes P-channel MOS transistors 121a and 121b, an N-channel MOS transistor 121c and a capacitor 121d.

The P-channel MOS transistor 121a constitutes a current source. A source of the P-channel MOS transistor 121a is connected to the power source VDD and a drain thereof is connected to a source of the P-channel MOS transistor 121b. A gate of the P-channel MOS transistor 121a is connected to a potential of a node of a gate and a drain of the P-channel MOS transistor 112 and a drain of the N-channel MOS transistor 111.

The P-channel MOS transistor 121b has a drain connected to a drain of the N-channel transistor 121c and is grounded via the capacitor 121d. A source of the N-channel transistor 121c is grounded.

Respective drains of the P-channel MOS transistor 121b and the N-channel transistor 121c which constitute a delay cell are connected to respective gates of the P-channel MOS transistor 121b and the N-channel transistor 121c which constitute a delay cell in the subsequent stage. Moreover, respective drains (which will be referred to as output ends) of the P-channel MOS transistor 121b and the N-channel transistor 121c which constitute a delay cell in the last stage are connected to respective gates of the P-channel MOS transistor 121b and the N-channel transistor 121c which constitute a delay cell in the first stage.

Next, the operation of the voltage controlled oscillation circuit 100 will be described.

First, when the input voltage Vin is larger than Vth (which is a threshold voltage of a transistor), a potential of a node (i.e., a node A) of the N-channel MOS transistor 111 and the resistor 113 in FIG. 2 is about (Vin−Vth).

Therefore, if a resistance value R113 of the resistor 113 is R113, a current I1 flowing in the N-channel MOS transistor 111 and the resistor 113 is determined by:

$$I1=(Vin-Vth)/R113.$$

That is, in the resistor 113, the input voltage Vin is shifted by Vth and thus a linear current to an input voltage flows.

Since the input voltage Vin is connected to a gate of the N-channel MOS transistor 114, a current I2 flowing in the N-channel MOS transistor 114 is determined by:

$$I2=\beta/2\times(Vin-Vth)\hat{}2.$$

That is, in the N-channel MOS transistor 114, the input voltage Vin is shifted by Vth and thus a current exhibiting the characteristic that an increase rate for a slope to the input voltage flows. Note that the symbol ^ is an exponentiation operator.

Since the current I1 flowing the N-channel MOS transistor 111 and the resistor 113 and the current I2 flowing in the N-channel MOS transistor 114 flow in the P-channel MOS transistor 112, the input voltage converted current value Io of the input voltage converted current source (i.e., the P-channel MOS transistor 112) is determined by:

$$Io=(Vin-Vth)/R113+\beta/2\times(Vin-Vth)\hat{}2.$$

For β in the above expression, β=u×Cox×W/L (where u is the degree of electron movement, Cox is a gate capacitance, W is a channel width and L is a channel length of a transistor) holds. Vth denotes a threshold voltage of the transistor.

When a voltage applied to respective gates of the P-channel MOS transistor 121b and the N-channel transistor 121c in a delay cell is a Low level, a current value of a current which the P-channel MOS transistor 121b passes is determined by a current source (i.e., the P-channel MOS transistor 121a) in the delay cell and the current value is the input voltage converted current value Io (=I1+I2).

The oscillation frequency fout of the output signal Vout is determined according to a current obtained by adding the linear current I1 to the input voltage and the current I12 exhibiting the characteristic that an increase rate for a slope to the input voltage is positive.

That is, according to this reference example, in contrast to the case where the oscillation frequency is reduced in a high frequency region if only the current I1 having a linear characteristic to an input voltage flows, reduction in the oscillation frequency can be corrected by the current I2 exhibiting the characteristic that an increase rate for a slope to the input voltage is positive.

Note that the reference example can be realized by providing, instead of the N-channel MOS transistor 114, a diode which is a device exhibiting the characteristic that an increase rate for a slope to the input voltage is positive.

Modified Example of Reference Example 1

Figure 3:
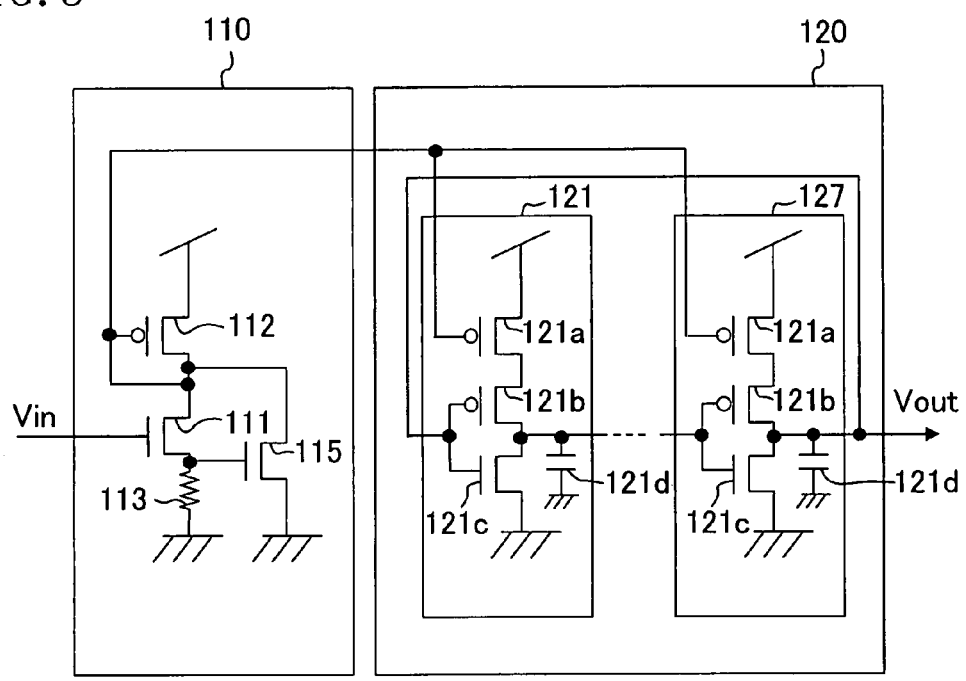
FIG. 3 is a block diagram illustrating a configuration of a voltage controlled oscillation circuit according to a modified example of Reference Example 1.

As shown in FIG. 3, instead of the N-channel MOS transistor 114, in the voltage-to-current conversion circuit 110, an N-channel MOS transistor 115 may be provided.

The N-channel MOS transistor 115 has a gate connected to a node (i.e., a node A) of the N-channel MOS transistor 111 and the P-channel MOS transistor 112, a drain connected a node of the N-channel MOS transistor 111 and the P-channel MOS transistor 112 and a source grounded.

In this modified example, when the input voltage Vin is larger than a threshold voltage Vth, a potential of the node A is about (Vin−Vth). Therefore, if a resistance value of the resistor 113 is R113, a current I3 flowing in the resistor 113 is expressed by:

$$I3=(Vin-Vth)/R113.$$

That is, in the resistor 113, the input voltage Vin is shifted by Vth and thus a linear current to an input voltage flows.

Furthermore, since the voltage at the node A is connected to a gate of the N-channel MOS transistor 115, a current I4 flowing in the N-channel MOS transistor 115 is determined by:

$$I4=\beta/2\times(Vin-\times Vth)^2.$$

That is, in the N-channel MOS transistor 115, the input voltage Vin is shifted by 2×Vth and thus a current exhibiting the characteristic that an increase rate for a slope to the input voltage is positive flows.

Since each of the current I3 flowing in the resistor 113 and the current I4 flowing in the N-channel MOS transistor 115 flows in the P-channel MOS transistor 112, a current value Io flowing in an input voltage converted current source (i.e., the P-channel MOS transistor 112) is determined by:

$$Io=(Vin-Vth)/R113+\beta/2\times(Vin-Vth)^2.$$

Therefore, in this modified example, in contrast to the case where the oscillation frequency is reduced in a high frequency region, reduction in the oscillation frequency can be corrected by the current I4 exhibiting the characteristic that an increase rate for a slope to the input voltage is positive.

Note that this modified example can be also realized by providing, instead of the N-channel MOS transistor 115, a diode which is a device exhibiting the characteristic that an increase rate for a slope to the input voltage is positive.

Reference Example 2

Figure 4:
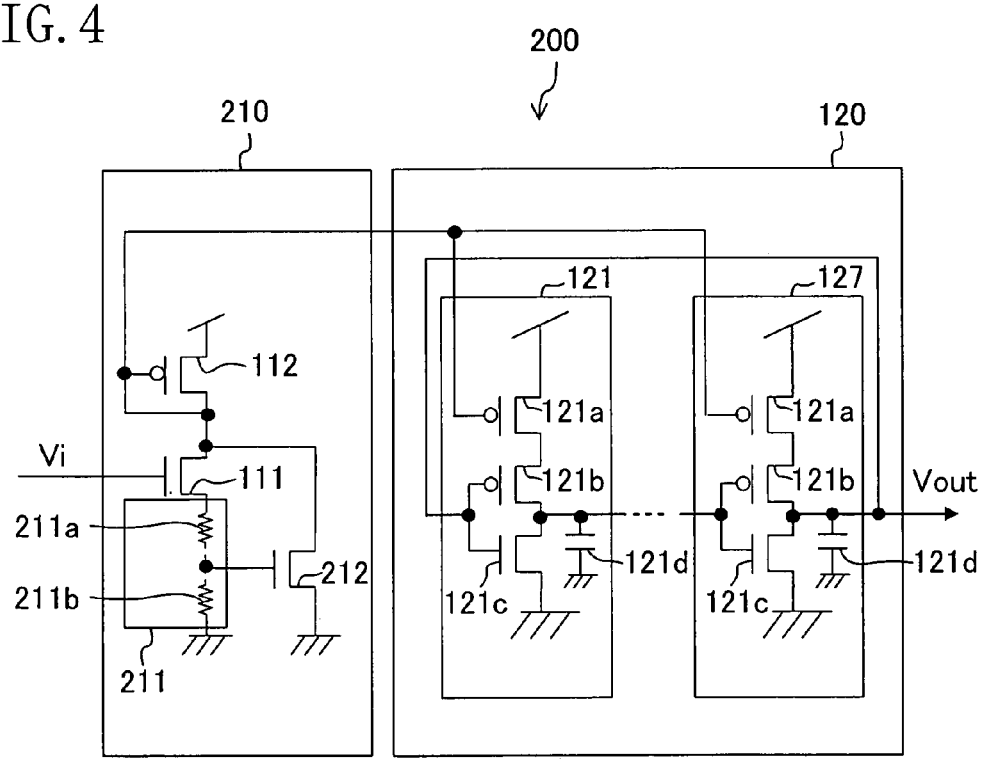
FIG. 4 is a block diagram illustrating a configuration of a voltage controlled oscillation circuit according to Reference Example 2.
Figure 5:
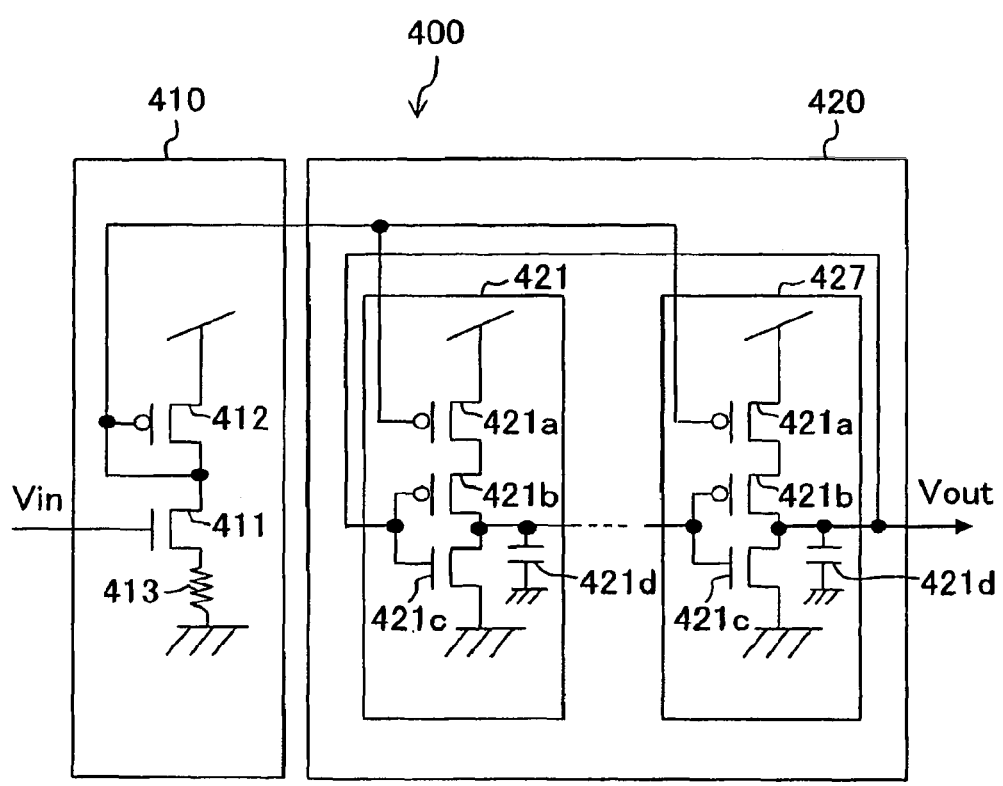
FIG. 5 is a block diagram illustrating a configuration of a voltage controlled oscillation circuit according to a known example.
Figure 6:
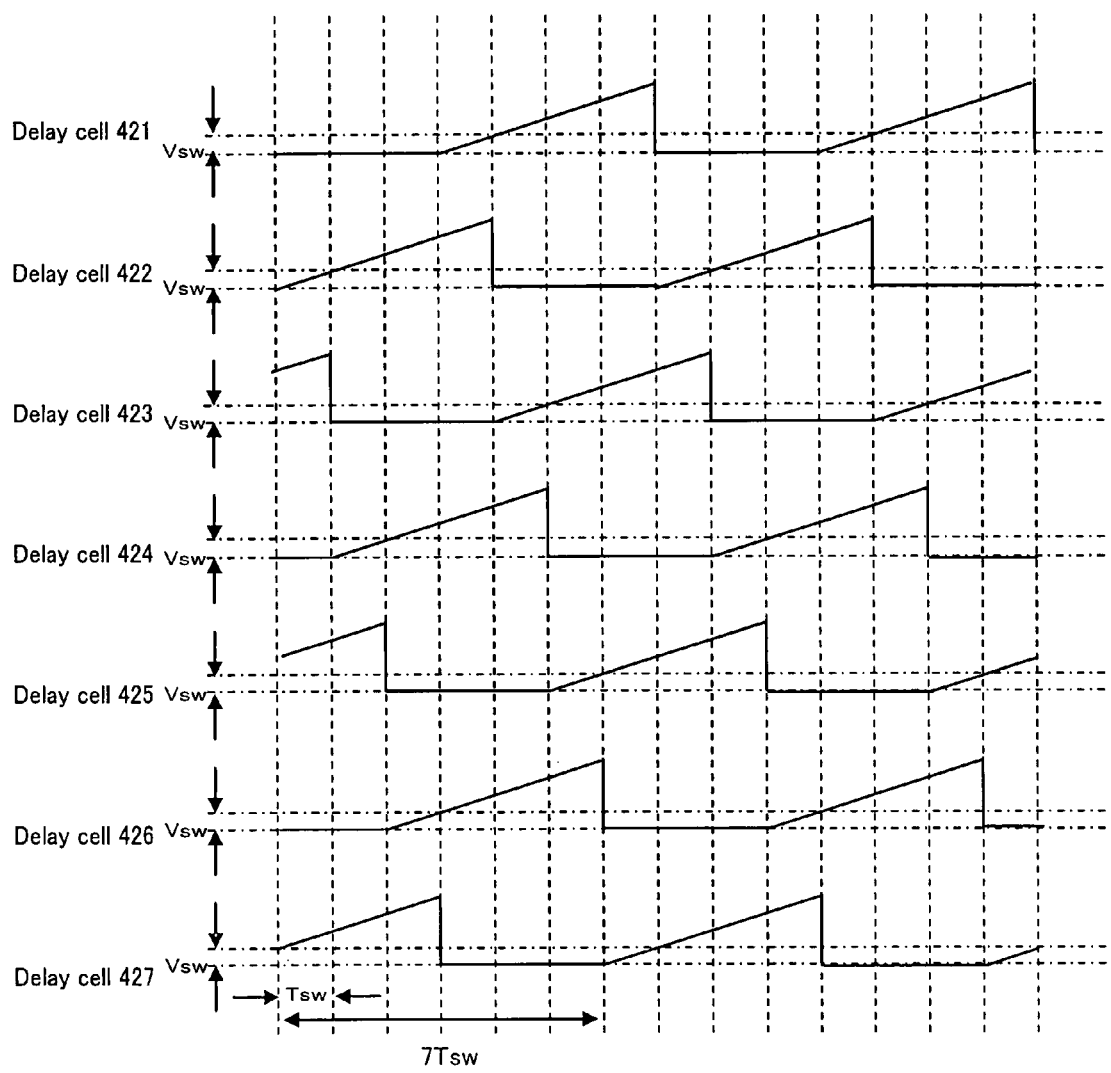
FIG. 6 is a diagram illustrating output signals of delay cells.

FIG. 4 is a block diagram illustrating a configuration of a voltage controlled oscillation circuit 200 according to Reference Example 2. As shown in FIG. 4, the voltage controlled oscillation circuit 200 includes a voltage-to-current conversion circuit 210 and a current controlled oscillation circuit 120.

The voltage-to-current conversion circuit 210 includes an N-channel MOS transistor 111, a P-channel MOS transistor 112, a resistor 211 and an N-channel MOS transistor 212.

The resistor 211 includes a resistor 211a and a resistor 211b connected in series. One end of the resistor 211 is connected to a source of the N-channel MOS transistor 111 and the other end is grounded.

A gate of the N-channel MOS transistor 212 is connected to either one of a node of the N-channel MOS transistor 111 and the resistor 211 and a node of the resistor 211a and the resistor 211b. In the example of FIG. 4, the gate is connected to the node of the resistors 211a and 211b.

A drain of the N-channel MOS transistor 212 is connected to a node of the N-channel MOS transistor 111 and the P-channel MOS transistor 112 and a source thereof is grounded.

Next, the operation of the voltage controlled oscillation circuit 200 will be described.

In the voltage controlled oscillation circuit 200, when an input voltage is larger than Vth, a voltage at a node A of the N-channel MOS transistor 111 and the resistor 211 is about (Vin−Vth). Therefore, if a resistance value of the resistor 211 is R211, a current I6 flowing in the resistor 211 and the N-channel MOS transistor 111 is determined by:

$$I6=(Vin-Vth)/R211.$$

Therefore, in the resistor 211, the input voltage Vin is shifted by Vth and thus a linear current to the input current flows.

Moreover, a voltage obtained by resistance dividing the voltage at the node A is applied to a gate of the N-channel MOS transistor 212. If a potential at a gate of the N-channel MOS transistor 212 is Vb, the following expression holds.

$$Vb=\alpha\times(Vin-Vth)$$

In the above expression, α is a constant of 0 to 1.

Accordingly, if the potential at the gate of the N-channel MOS transistor 212 is Vb, a current I7 flowing in the N-channel MOS transistor 212 is determined by:

$$I7=\beta/2\times(Vb-Vth)^2.$$

Then, when the gate potential Vb is replaced with the above expression, $$I7=\beta/2\times\alpha^2\times(Vin-(Vth+Vth/\alpha))^2$$

is obtained. Therefore, in the N-channel MOS transistor 212, the input voltage Vin is shifted by (Vth+Vth/α) and thus a current exhibiting the characteristic that an increase rate for a slope to the input voltage is positive flows.

Since the current I6 flowing in the resistor 211 and the N-channel MOS transistor 111 and the current I7 flowing in the N-channel MOS transistor 212 flow in the P-channel MOS transistor 112, the input voltage converted current value Io flowing in the input voltage converted current source (i.e., the P-channel MOS transistor 112) is determined by:

$$Io=(Vin-Vth)/R105+\beta/2\times\alpha^2\times(Vin-(Vth+Vth/\alpha))^2.$$

As has been described, in the voltage controlled oscillation circuit 200, reduction in the oscillation frequency in a high frequency region can be corrected by I7 exhibiting the characteristic that an increase rate for a slope to an input voltage is positive.

Moreover, if a voltage applied to the gate of the N-channel MOS transistor 212 is changed by changing respective resistance values of the resistors 211a and 211b constituting the resistor 211, a voltage at which correction of an output frequency is started can be arbitrarily set.

Note that also this reference example can be realized by providing, instead of the N-channel MOS transistor 212, a diode which is a device exhibiting the characteristic that an increase rate for a slope to the input voltage is positive.

INDUSTRIAL APPLICABILITY

A voltage controlled oscillation circuit according to the present invention has the effect of making an output frequency linear to an input voltage within a wide frequency range. Therefore, an inventive voltage controlled oscillation circuit is useful as a voltage controlled oscillation circuit or the like of which an oscillation frequency is controlled according to an input voltage.

The invention claimed:
1. A voltage controlled oscillation circuit comprising:
a voltage-to-current conversion circuit, which includes a first current source and a plurality of second current sources, each being configured to output a current according to an input voltage, the voltage-to-current conversion circuit generates a current obtained by adding a current output by the first current source and currents output by the plurality of second current sources; and a current controlled oscillation circuit of which an oscillation frequency varies according to a value of an output current of the voltage-to-current conversion circuit, wherein:
the first current source includes a first MOS transistor and is configured so that the input voltage is applied to a gate of the first MOS transistor, an end of a current path of the first MOS transistor is connected to a reference voltage via a first resistor and a second resistor, and thereby a current is caused to pass through the current path, and
each of the plurality of second current sources includes a second MOS transistor and is configured so that a voltage at a connection node of the first resistor and the second resistor is provided to a gate of the second MOS transistor, an end of a current path of the second MOS transistor is connected to the reference voltage via at least one resistor, and thereby a current is caused to pass through the current path.
2. The voltage controlled oscillation circuit of claim 1, wherein:
each of the first and second MOS transistors are N-channel MOS transistors, and the reference voltage is ground.

* * * * *